United States Patent
Depetro et al.

(10) Patent No.: US 9,385,049 B2
(45) Date of Patent: Jul. 5, 2016

(54) PROCESS FOR MANUFACTURING INTEGRATED DEVICE INCORPORATING LOW-VOLTAGE COMPONENTS AND POWER COMPONENTS

(71) Applicant: STMicroelectronics S.r.L., Agrate Brianza (IT)

(72) Inventors: Riccardo Depetro, Domodossola (IT); Stefano Manzini, Novara (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/607,438

(22) Filed: Jan. 28, 2015

(65) Prior Publication Data

US 2015/0140750 A1  May 21, 2015

Related U.S. Application Data

(62) Division of application No. 12/839,989, filed on Jul. 20, 2010, now Pat. No. 8,975,723.

(30) Foreign Application Priority Data

Jul. 21, 2009  (IT) .............................. TO2009A0550

(51) Int. Cl.
*H01L 21/31* (2006.01)
*H01L 21/8238* (2006.01)
(Continued)

(52) U.S. Cl.
CPC ...... *H01L 21/823878* (2013.01); *H01L 21/265* (2013.01); *H01L 21/31111* (2013.01); *H01L 21/76224* (2013.01); *H01L 21/82385* (2013.01); *H01L 21/823807* (2013.01); *H01L 21/823814* (2013.01); *H01L 21/823857* (2013.01); *H01L 29/41766* (2013.01); *H01L 29/0653* (2013.01); *H01L 29/0657* (2013.01); *H01L 29/0865* (2013.01); *H01L 29/0882* (2013.01); *H01L 29/42368* (2013.01); *H01L 29/66696* (2013.01); *H01L 29/66704* (2013.01); *H01L 29/7816* (2013.01)

(58) Field of Classification Search
CPC ................. H01L 21/76224; H01L 21/823878; H01L 29/0653; H01L 29/41766; H01L 29/66696
See application file for complete search history.

(56) References Cited

U.S. PATENT DOCUMENTS 6,046,474 A    4/2000  Oh et al.
6,444,528 B1 * 9/2002  Murphy ........................ 438/270
(Continued)

OTHER PUBLICATIONS

IT Search Report for TO2009A000550 dated Mar. 1, 2010 (2 pages).

*Primary Examiner* — Eduardo A Rodela
*Assistant Examiner* — Christopher M Roland
(74) *Attorney, Agent, or Firm* — Gardere Wynne Sewell LLP

(57) ABSTRACT

An integrated device includes: a semiconductor body having a first, depressed, portion and second portions which project from the first portion; a STI structure, extending on the first portion of the semiconductor body, which delimits laterally the second portions and has a face adjacent to a surface of the first portion; low-voltage CMOS components, housed in the second portions, in a first region of the semiconductor body; and a power component, in a second region of the semiconductor body. The power component has at least one conduction region, formed in the first portion of the semiconductor body, and a conduction contact, coupled to the conduction region and traversing the STI structure in a direction perpendicular to the surface of the first portion of the semiconductor body.

14 Claims, 7 Drawing Sheets

(51) Int. Cl.
*H01L 29/417* (2006.01)
*H01L 21/762* (2006.01)
*H01L 21/265* (2006.01)
*H01L 21/311* (2006.01)
*H01L 29/06* (2006.01)
*H01L 29/08* (2006.01)
*H01L 29/423* (2006.01)
*H01L 29/66* (2006.01)
*H01L 29/78* (2006.01)

(56) References Cited

U.S. PATENT DOCUMENTS

| | | | |
|---|---|---|---|
| 6,965,253 B1 * | 11/2005 | Chen | H03K 17/162 326/81 |
| 2003/0119289 A1 * | 6/2003 | Bryant | B01J 19/0093 438/589 |
| 2005/0006716 A1 | 1/2005 | Kumar et al. | |
| 2005/0087800 A1 | 4/2005 | Sugi et al. | |
| 2006/0138549 A1 | 6/2006 | Ko | |
| 2008/0057682 A1 | 3/2008 | Bresolin et al. | |

* cited by examiner

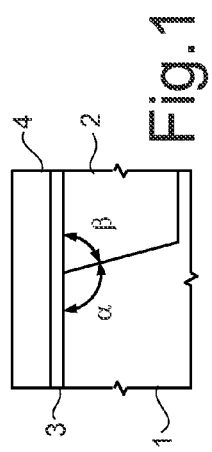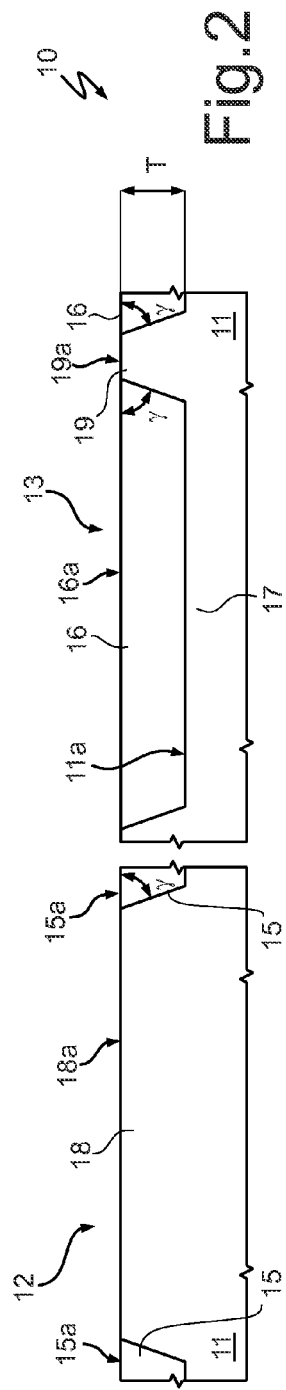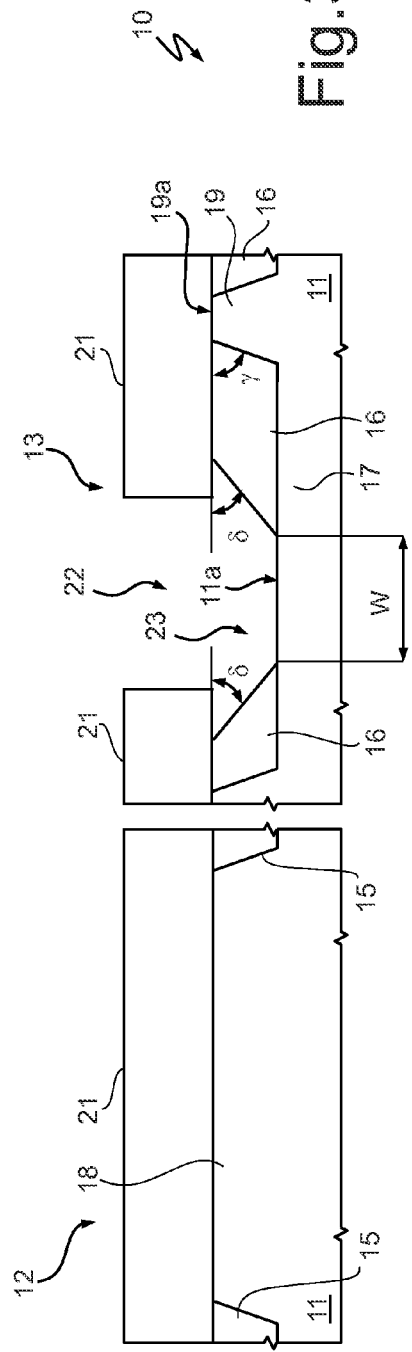

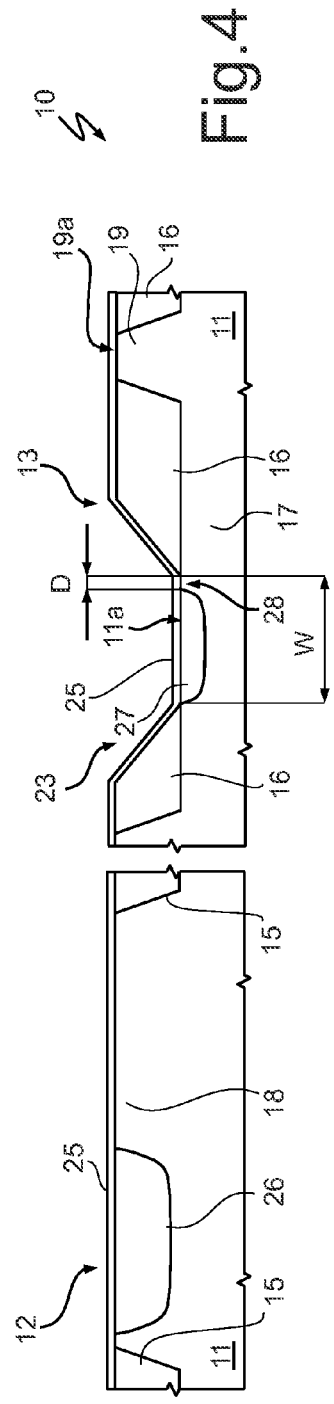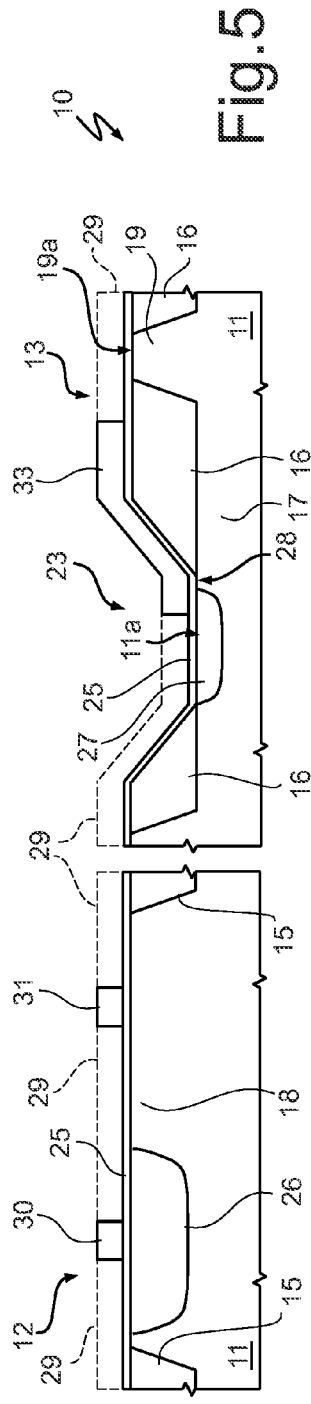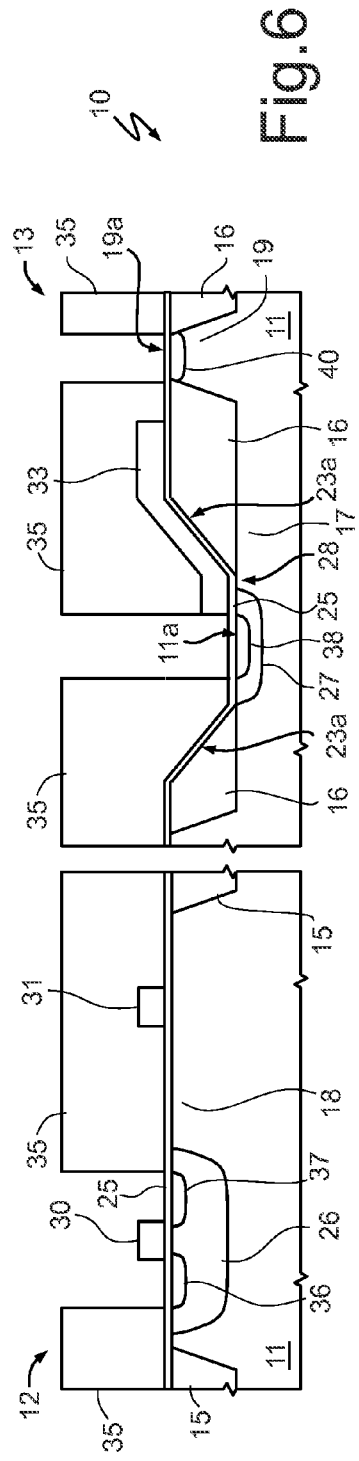

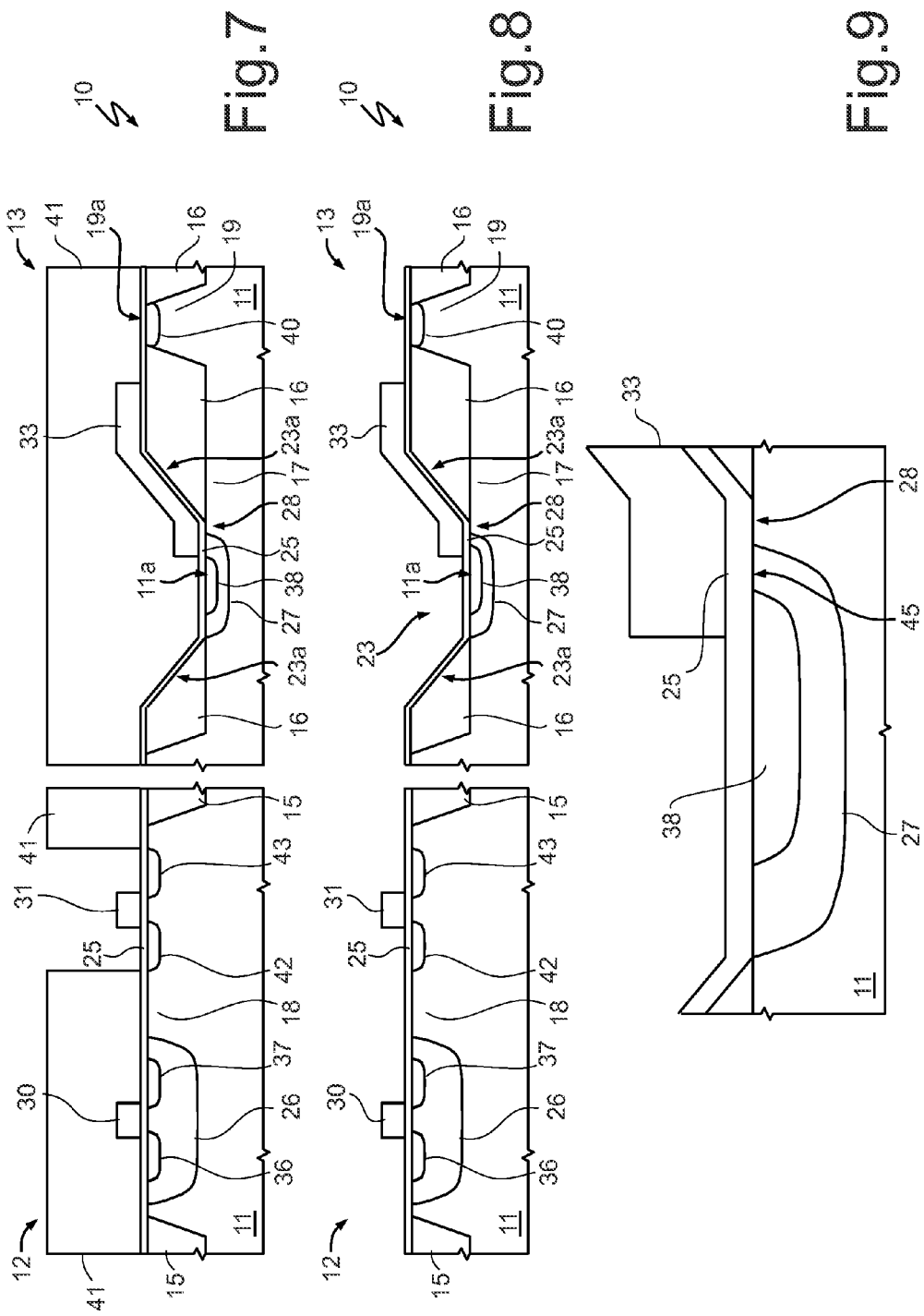

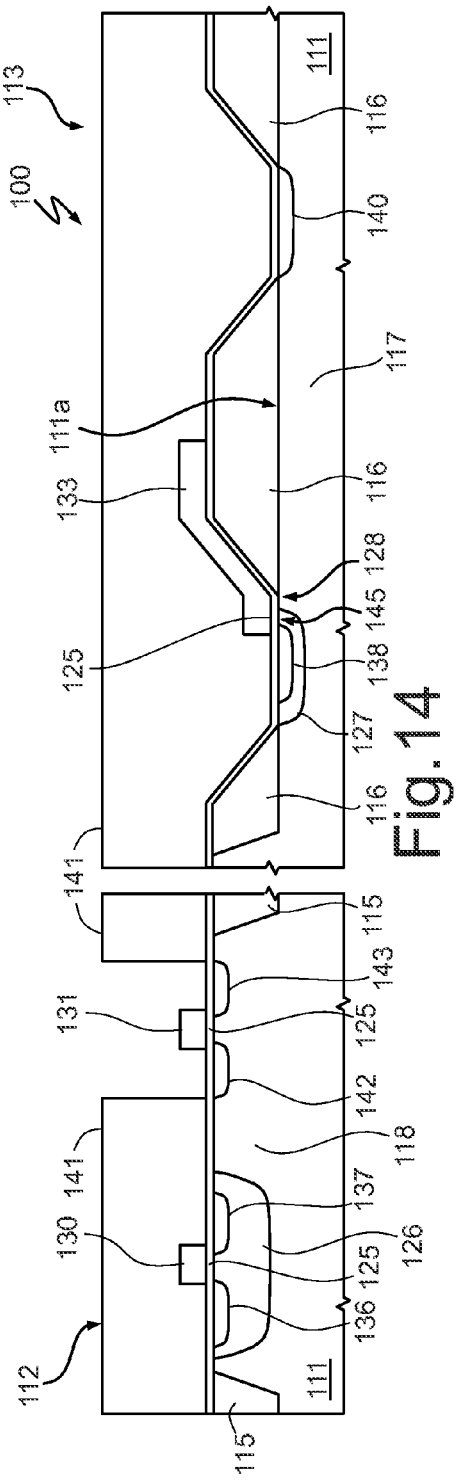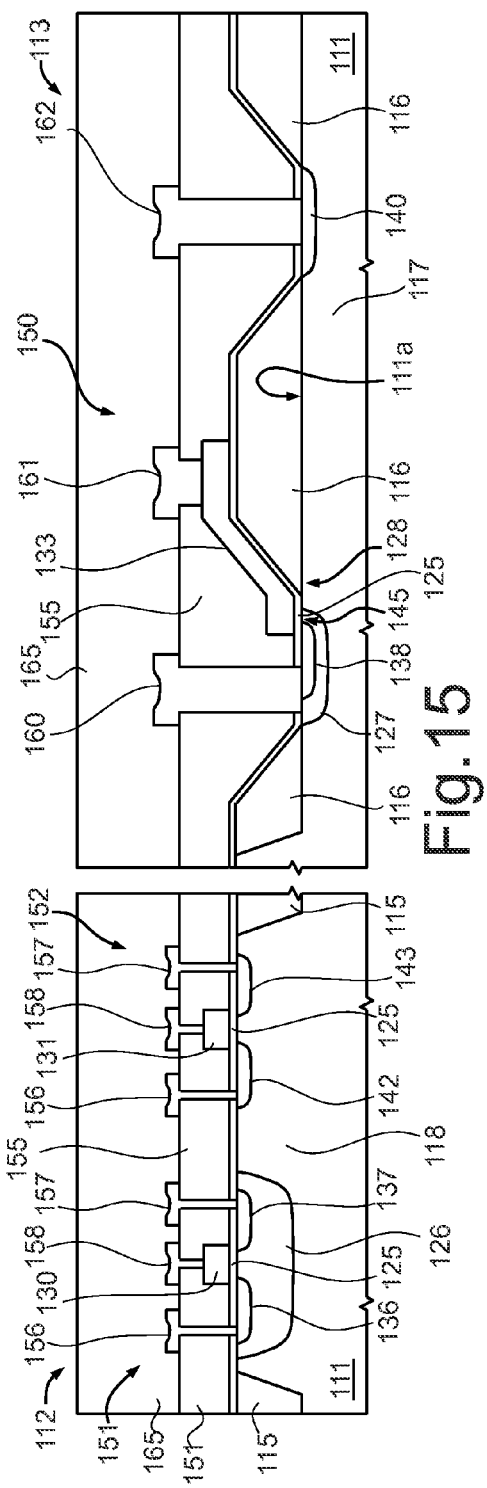

PROCESS FOR MANUFACTURING INTEGRATED DEVICE INCORPORATING LOW-VOLTAGE COMPONENTS AND POWER COMPONENTS

CROSS-REFERENCE TO RELATED APPLICATIONS

This application is a divisional of U.S. patent application Ser. No. 12/839,989 filed Jul. 20, 2010, which claims priority from Italian Patent Application No. TO2009A000550, filed Jul. 21, 2009, the disclosures of which are incorporated herein by reference.

TECHNICAL FIELD

Embodiments herein relate to an integrated device incorporating low-voltage components and power components and to a process for manufacturing said device.

BACKGROUND

As is known, for several applications of microelectronics, a need has risen to integrate low-voltage devices and power devices (which operate at voltages that range from approximately 15 V to beyond 1000 V) in a single semiconductor chip. In particular, it has become increasingly more frequent to provide low-voltage devices in CMOS technology in a first portion of the chip and power devices, which are compatible with CMOS technology, in a second portion of the same chip. The active areas that house the various devices, both low-voltage devices and power devices, are insulated from one another using the shallow-trench insulation (STI) technique, which enables an extremely high degree of integration, with extremely small overall dimensions, and for this reason is typically used in CMOS technology. In practice, the substrate of a semiconductor wafer is selectively etched through a hard mask, for example, a multilayer mask of silicon oxide and silicon nitride, and trenches are formed, which delimit and separate active areas for low-voltage devices and active areas for power devices. The trenches are oxidized and completely filled with deposited dielectric, normally silicon oxide. The wafer is then planarized, and the hard mask is thus removed. The active areas are hence separated from one another by insulating structures with practically vertical walls, which extend for a stretch in the substrate.

SUMMARY

The manufacturing of power devices with CMOS technology, in particular in active areas defined by STI, shows, however, its limits when the scale of integration is pushed beyond a certain threshold. These limits begin to show up with the 0.25-µm technology and become evident with the 0.18-µm technology. As already mentioned, the walls of the STI structures are almost vertical (normally with an inclination of between 80° and 90°), precisely in order to minimize the extension of the transition areas between the thin oxide (gate oxide) and the thick oxide and thus reduce the overall dimensions. The corresponding interface in the silicon consequently has equally marked angles, as is shown in FIG. 1, where the reference number 1 designates a substrate of semiconductor material, in which a STI structure 2 is provided. The substrate 1 and the STI structure 2 are overlaid by a gate-oxide layer 3 and by a gate region 4 made of polycrystalline silicon. The angle α formed between the faces of the substrate 1 contiguous, respectively, to the STI structure 2 and to the gate-oxide layer 3 is 180°-β, where β indicates the slope of the walls of the STI structure 2. The angle α is hence approximately 90°-100° and causes a significant concentration of the electrical-field lines, in particular in the proximity of the region where the channel of the power device is formed. The concentration of the electrical-field lines may adversely affect both the active-state resistance $R_{ON}$ (which is high and instable owing to injection of hot carriers) and the breakdown voltage (BV) of the power components.

In effect, problems of reliability and performance may arise and render incompatible the conventional use of the STI to provide power components integrated with low-voltage CMOS devices.

An embodiment of the present invention is to provide an integrated device and a process for manufacturing said integrated device that will enable the limitations described to be overcome.

BRIEF DESCRIPTION OF THE DRAWINGS

For a better understanding of the disclosure, some embodiments thereof will now be described, purely by way of non-limiting example and with reference to the attached drawings, wherein:

FIG. 1 is a cross section through a known integrated device;

FIG. 2 is a cross section through a semiconductor wafer in an initial step of a process for manufacturing an integrated device according to one embodiment;

FIGS. 3-8 show the cross section of FIG. 2 in subsequent processing steps according to an embodiment;

FIG. 9 shows an enlarged detail of FIG. 8;

FIGS. 12-14 show the cross section of FIG. 11 in subsequent processing steps according to an embodiment;

FIG. 15 is a cross section of an integrated device according to another embodiment, obtained by dicing the wafer of FIG. 14 after final processing steps;

DETAILED DESCRIPTION

Figure 10:
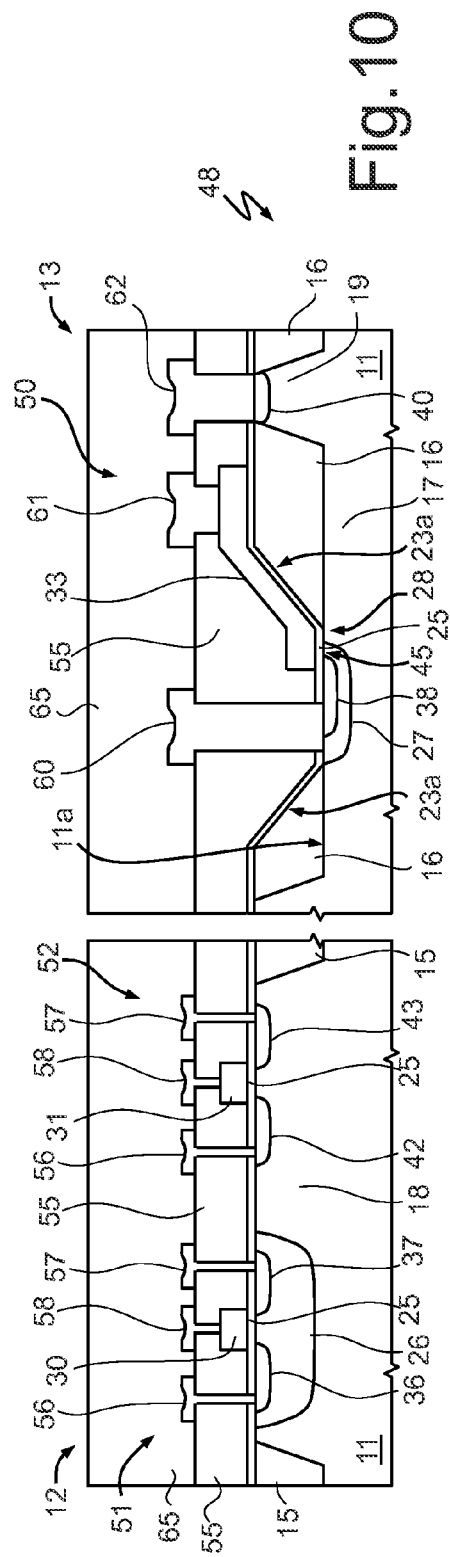
FIG. 10 is a cross section of an integrated device according to one embodiment, obtained by dicing the wafer of FIG. 8 after final processing steps.
Figure 11:
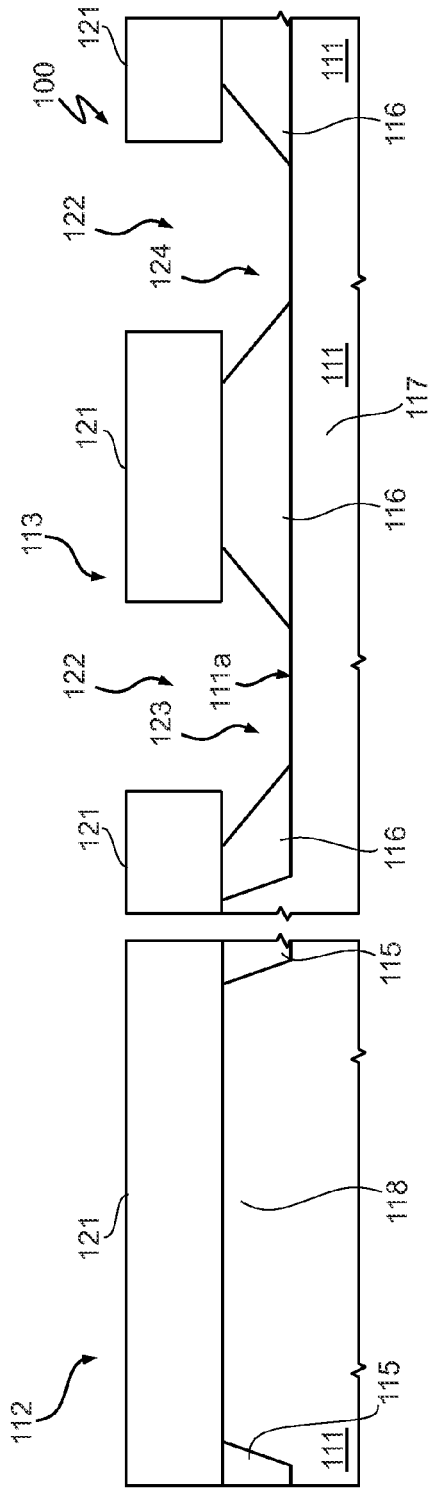
FIG. 11 is a cross section through a semiconductor wafer in an initial step of a process for manufacturing an integrated device according to a different embodiment.

FIG. 2 shows a cross section through a semiconductor wafer, designated as a whole by the reference number 10, which comprises a structural layer, for example a substrate 11 of monocrystalline silicon of an N type, in which a low-voltage region 12 and a power region 13 have been defined (said regions are not represented in scale in the annexed figures, for simplicity; in particular, the low-voltage region 12 is enlarged). In a different embodiment (not illustrated), the structural layer may be an epitaxial layer grown on the substrate 11.

Inside the substrate 11, in particular, an insulating structure of a shallow-trench-insulation (STI) type has been preliminarily provided, which comprises at least a first insulating well 15 and a second insulating well 16, respectively formed in the low-voltage region 12 and in the power region 13 and having a thickness T. The first insulating well 15 has at least one opening, which laterally delimits an active area 18, which project from depressed portions 17 of the substrate 11 and are designed to house CMOS devices. The second insulating well 16 occupies at least one portion of the power region 13 and extends above the depressed portions 17 of the substrate 11. In one embodiment, the second insulating well 16 extends substantially throughout the power region 13 and has at least one opening, which delimits laterally a raised drain region 19 and also projects from the depressed portion 17 of the substrate 11.

The insulating wells 15, 16 that form the insulating structure are obtained by a conventional STI process (not shown) and can be coupled or separate, according to the design requirements. In practice, the substrate 11 is etched through a hard mask to form trenches of a depth and shape corresponding to those of the first and second insulating wells 15, 16. The trenches are filled with a dielectric material, for example silicon oxide, and the wafer 10 is then planarized with a process that is stopped when the highest portions of the substrate 11 are reached (i.e., the surface of the active areas 18 and of the raised drain region 19), after the hard mask has been removed.

The structure of the substrate 11 is hence not planar. The active areas 18 and the raised drain region 19 have respective raised surfaces 18a, 19a substantially aligned with top surfaces 15a, 16a of the insulating wells 15, 16. In the regions occupied by the insulating wells 15, 16, instead, the substrate 11 has depressed surfaces 11a at a depth, with respect to the raised surfaces 18a, 19a, equal to the thickness T of the insulating wells 15, 16 themselves. The transition areas between the depressed surfaces 11a and the raised surfaces 18a, 19a have a slope γ close to the vertical and comprised, for example, between 80° and 90°.

As shown in FIG. 3, a resist mask 21 is formed on the wafer 10. The resist mask 21 entirely coats the low-voltage region 12 and has a window 22 on top of the second insulating well 16. The second insulating well 16 is then selectively etched, for example, in an isotropic way, through the resist mask 21, and a through source window 23 is formed of a width W at the bottom, which exposes an underlying portion of the substrate 11. The etch, for example a wet etch, is controlled in such a way that the slope δ of the walls 23a that delimit the source window 23 is lower than the slope γ of the areas of transition between the depressed surfaces 11a and the raised surfaces 18a, 19a. For example, the slope δ is comprised between 20° and 70°.

After removal of the resist mask 21 (FIG. 4), a gate-oxide layer 25, having a thickness, for example, of between 5 nm and 50 nm, is thermally grown on the wafer 10. At this point the wafer 10 is coated by thick-oxide regions (first and second insulating wells 15, 16) and by thin-oxide regions, where the gate-oxide layer 25 overlies directly the silicon of the substrate 11.

By a P-type body implantation and subsequent diffusion, low-voltage body wells 26 are then provided in the low-voltage region 12, and a power body well 27 is provided in the depressed portion 17 of the substrate 11 underlying the source window 23.

Implantation of a P-type dopant species and diffusion are performed so that the power body well 27 does not occupy the entire width W of the source window 23, but is separated by a distance D from the edge of the second insulating well 16 towards the raised drain region 19. The portion of substrate between the second insulating well 16 and the power body well 27 defines a drain-junction region 28.

Then, a polysilicon layer 29, indicated by a dashed line in FIG. 5, is deposited and shaped to form low-voltage gate regions 30, 31 and a power gate region 33. The low-voltage gate regions 30, 31 are made in the low-voltage region 12, on the active area 18, where low-voltage CMOS components are to be provided. The power gate region 33 is arranged in part in the source window 23 and in part on the second insulating well 16, between the source window 23 and the raised drain region 19. In greater detail, the power gate region 33 extends on the drain-junction region 28 and on part of the power body well 27, without, however, occupying the bottom of the source window 23 completely. The power gate region 30 lies moreover on one of the walls 23a that delimit the source window 23, towards the raised drain region 19, and extends for a stretch on the second insulating well 16 in the same direction.

An N+ implantation and a P+ implantation are then carried out.

For the implantation of an N-type dopant species (N+ implantation, FIG. 6), a first implantation mask 35 is used, which exposes portions of the low-voltage body wells 26, alongside the gate regions 30 (in effect, it is the gate-oxide layer 25 that is exposed, which, however, is traversed by the implanted species; hence, for reasons of simplicity, reference will be hereinafter made to the underlying regions as exposed regions, neglecting the presence of the gate-oxide layer 25 as regards the implantation steps). In the power region 13, the first implantation mask 35 exposes the power body well 27 and the raised drain region 19. In particular, in the source window 23 the first implantation mask 35 is aligned with the power gate region 33. In the low-voltage body wells 26 low-voltage source regions 36 and low-voltage drain regions 37 are thus made, while in the power body well 27 a power source region 38 is formed and in the raised drain region 19 a drain-contact region 40 is formed. Both the power body well 27 and the power source region 38 are thus formed in the depressed portion 17 of the substrate 11 and are adjacent to the second insulating well 16. The power source region 38 is housed in the power body well 27.

With reference to FIG. 7, for the implantation of a P-type dopant species (P+ implantation) a second implantation mask 41 is used, which protects the power region 13 and the low-voltage body wells 26 and exposes portions of the substrate 11 in the active area 18 around the low-voltage gate regions 31. Low-voltage source regions 42 and low-voltage drain regions 43 are thus made.

Once also the second implantation mask 41 has been removed, the dopants implanted are thermally diffused (FIG. 8). In this step, in particular, the power source region 38 diffuses under the power gate region 33, as shown in the enlarged view of FIG. 9. Consequently, the power gate region 33 extends: on the drain-junction region 28; on a channel region 45, defined by a portion of the power body well 27 comprised between the drain-junction region 28 and the power source region 38; and on a portion of the power source region 38.

The gate-oxide layer 25 insulates the power gate region 33 from the drain-junction region 28, from the channel region 45, and from the power source region 38.

The process is then terminated by steps of contact manufacturing and protection, to obtain an integrated device 48 (shown in FIG. 10), which comprises a power component 50, in particular a lateral NMOS transistor, in the power region 13, and low-voltage CMOS components (NMOS transistors 51 and PMOS transistors 52), in the low-voltage region 12.

A first insulating layer 55, for example, of silicon oxide, is deposited over the entire wafer 10 and selectively etched, together with the gate-oxide layer 25, to open contact windows on the low-voltage source regions 36, 42 and on the low-voltage drain regions 37, 43 in the low-voltage region 12. Further contact windows are opened on the power source region 38 so as to expose also part of the power body well 27, on the power gate region 33 and on the drain-contact region 40. Then, a metal layer is deposited and shaped so as to form, in the low-voltage region 12, low-voltage source contacts 56, low-voltage drain contacts 57, and low-voltage gate contacts 58. In the power region 13, instead, there are made a power source contact 60, which connects in short circuit the power source region 38 and the power body well 33, a power gate contact 61 (on the portion of the power gate region 33 that lies on the second insulating well 16), and a power drain contact 62, on the drain-contact region 40. After having provided a second metal layer (not shown for reasons of simplicity), the wafer 10 is coated with a second insulating protection layer 65 and is cut into dies, each of which incorporates an item of the integrated device 48 shown in FIG. 10.

As mentioned, the integrated device 48 comprises low-voltage CMOS components (NMOS transistors 51 and PMOS transistors 52), in the low-voltage region 12, and at least one power component 50 (lateral NMOS transistor) in the power region 13. The low-voltage CMOS components 51, 52 are provided in the active area 18, with the respective conduction regions (low-voltage source regions 36, 42 and low-voltage drain regions 37, 43) which emerge at the raised surface 18a of the active area 18. Given that the voltages involved in this region are modest, the characteristic angles of the STI do not pose limitations to proper operation of the CMOS components.

The power source region 38 and the power body well 27 of the power component 50 are, instead, provided in the depressed portion of the substrate 11 under the STI structure, in particular under the second insulating well 16, and emerge at the depressed surface 11a of the substrate 11, which is plane. For this reason, the drain-junction region 28, which is adjacent to the channel region 45 and is more critical for the high current density in the active state, does not have corners, and hence dangerous concentrations of the electrical-field lines are prevented. The geometry without corners in the areas of higher current density allows improvement in particular the breakdown voltage (BV) and the active-state resistance ($R_{ON}$) of the power components, which may be more reliable and efficient.

The integrated device described and the corresponding manufacturing process hence enable exploitation of the advantages of the insulation of an STI type, especially as regards the reduction of the area occupied, without, however, incurring in the limitations posed by the accentuated corners, typical of STI, for the production power components.

A different embodiment is shown in FIGS. 11-15.

A semiconductor wafer 100 (FIG. 11) has substantially the structure illustrated in FIG. 2 and comprises a substrate 111, in which a STI structure is provided. The STI structure comprises a first insulating well 115, which defines laterally active areas 118, which project from depressed portions 117 of the substrate 111 in a low-voltage region 12, and a second insulating well 116, which extends in a continuous way substantially over an entire power region 116. Also in this case, the structure of the substrate 111 is not planar. The structure of the substrate 111 is hence not planar. The active areas 118 have in fact respective raised surfaces 118a substantially aligned with top surfaces 115a, 116a of the insulating wells 115, 116. In the regions occupied by the insulating wells 115, 116, instead, the substrate 111 has depressed surfaces 111a at a depth with respect to raised surfaces 118a equal to the thickness T of the insulating wells 115, 116 themselves.

On the semiconductor wafer 100 a resist mask 121 is formed, which coats entirely the low-voltage region 112 and has windows 122 on the second insulating well 116. The second insulating well 116 is etched through the resist mask 121 and a through source window 123 and a through drain window 124 are formed, which expose respective underlying portions of the substrate 111.

Figure 12:
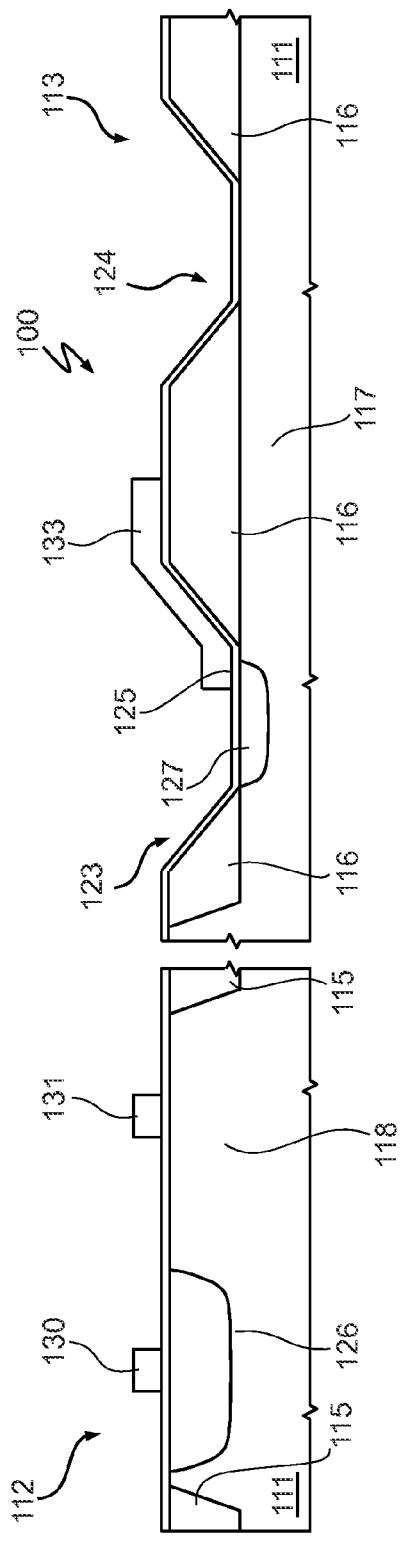
Figure 13:
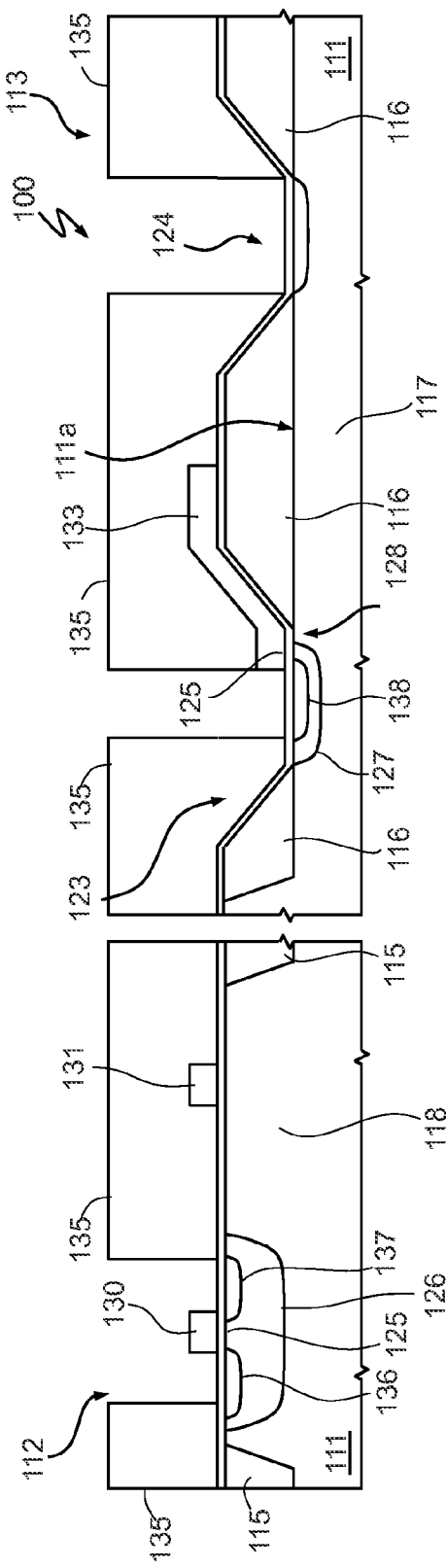

As already described previously, steps of body implantation, thermal oxidation, polysilicon deposition and subsequent shaping are then carried out to obtain the structure of FIG. 12. In particular, in these steps there are provided a gate-oxide layer 125, low-voltage body wells 126 and low-voltage gate regions 130, 131 in the active area 118, a power body well 127, in a depressed portion 117 of the substrate 111 underlying the source window 123, and a power gate region 133. The power gate region 133 extends on a part of the power body well 127, in part on a drain-junction region 128, adjacent to the power body well 127, and in part on the second insulating well 116.

N+ and P+ implantations are then carried out.

For the N+ implantation (FIG. 13), an implantation mask 135 is used, which exposes portions of the low-voltage body wells 126, alongside the gate regions 130. In the power region 113, the first implantation mask 135 exposes the power body well 127 and a portion of the substrate 111 under the drain window 124. In the low-voltage body wells 126 low-voltage source regions 136 and low-voltage drain regions 137 are thus provided, while in the power body well 127 a power source region 138 is formed and in the portion of the substrate 111 underlying the drain window 124 a drain-contact region 140 is formed. A channel region 145 is defined between the power body well 127 and the drain-junction region 128.

The P+ implantation (FIG. 14) is carried out substantially as already described previously, using a second implantation mask 141. Low-voltage source regions 142 and low-voltage drain regions 143 are thus provided.

The process is terminated as already described previously, with a diffusion, with the provision of metallizations and protection layers and with dicing of the wafer 100. In particular (FIG. 15), in these steps contacts are provided in the low-voltage region 112, namely, low-voltage source contacts 156, low-voltage drain contacts 157, and low-voltage gate contacts 158, and in the power region 113, namely, a power source contact 160, a power gate contact 161, and a power drain contact 162.

An integrated device 148 is thus provided, which comprises low-voltage CMOS components (NMOS transistors 151 and PMOS transistors 152), in the active areas 118 of the low-voltage region 12, and at least one power component 150 (lateral NMOS transistor) in the power region 113.

In the embodiment described, also the drain-contact region 140 is formed in a plane portion of the substrate 111, and hence the risks associated with formation of high electrical fields on account of the presence of sharp corners are further reduced.

The integrated device described can advantageously be used to provide control circuitry for MEMS (microelectromechanical system) devices, which are in turn designed to be incorporated in complex systems.

Figure 16:
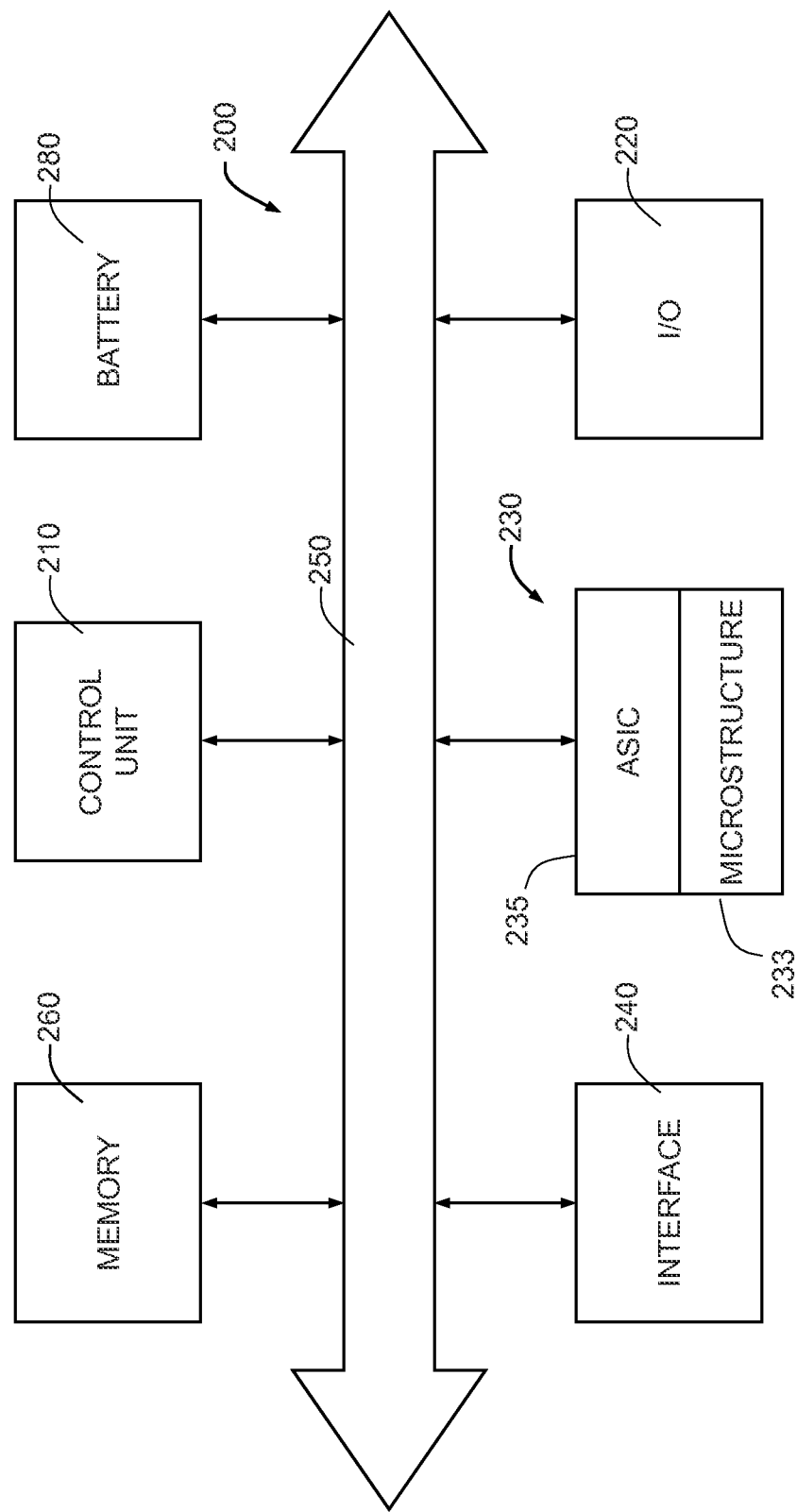
FIG. 16 is a simplified block diagram of an electronic system incorporating an integrated device according to one embodiment.

FIG. 16 illustrates a portion of a system 200 in accordance with one embodiment. The system 200 may comprise a controller 210, an input/output (I/O) device 220 (for example, a keyboard or a screen), a microelectromechanical device 230, a wireless interface 240, and a memory 260, of a volatile or non-volatile type, coupled to one another through a bus 250. In one embodiment, a battery 280 may be used for supplying the system 200.

The microelectromechanical device 230 comprises a microstructure 233 and an integrated device 235 (ASIC, Application-Specific Integrated Circuit) dedicated to driving and control of the read microstructure 233 and, possibly, to detection of measurable quantities by means of the microstructure 233. The integrated device 235 comprises low-voltage CMOS components and power components integrated in one and the same semiconductor chip and is provided according to what is described with reference to FIGS. 1-10 or, alternatively, according to what is described with reference to FIGS. 11-15.

In one embodiment, the microelectromechanical device 230 is a microelectromechanical sensor, such as, for example, an accelerometer, a gyroscope, a pressure sensor, a microphone. In a different embodiment, the microelectromechanical device 230 is a microactuator.

The controller 210 may comprise, for example, one or more microprocessors, microcontrollers, and the like.

The I/O device 220 may be used for generating a message. The system 200 may use the wireless interface 240 for transmitting and receiving messages to and from a wireless-communication network with a radiofrequency (RF) signal. Examples of wireless interface may comprise an antenna, a wireless transceiver, such as a dipole antenna. In addition, the I/O device 220 may provide a voltage representing what is stored both in the form of digital output (if digital information has been stored) and in the form of analog output (if analog information has been stored).

The system 200 may be used in apparatuses, such as, for example, a palmtop computer (personal digital assistant, PDA), a laptop or portable computer, possibly with wireless capacity, a cellphone, a messaging device, a digital music player, a digital camera, or other devices.

Finally, it is evident that modifications and variations may be made to the device and the process described, without thereby departing from the scope defined in the annexed claims.

In the first place, the integrated device may comprise an arbitrary number of STI wells coupled to one another or separate from one another. In the same way, the integrated device may comprise an arbitrary number of active areas and power components.

The implantations of an N type or P type for providing the body, source, and drain-contact regions may be carried out prior to formation of the STI wells. Clearly, in this case the source windows and, if necessary, the drain windows, are aligned to the underlying implantations.

Of course, it is possible to provide an embodiment in which the conductivity of the different regions of semiconductor material is opposite with respect to the one described above.

One or more of the components of FIG. 16 may be disposed on a same die (e.g., a system or a chip) or on respective dies.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A process for manufacturing an integrated device, comprising:
    forming a STI insulation structure in a semiconductor body that extends above a depressed first portion of the semiconductor body and laterally delimits second portions of the semiconductor body projecting from the first portion, said STI insulation structure having a sidewall with the second portions of the semiconductor body that is disposed at a first angle with respect to a plane defined by a top surface of the second portions that is less than ninety degrees;
    forming low-voltage CMOS components in the second portions;
    forming an aperture in the STI insulation structure to expose a region of the depressed first portion of the semiconductor body, said aperture having a sidewall that is disposed at a second angle with respect to the plane defined by the top surface of the second portions that is less than the first angle, wherein the first angle is between eighty and ninety degrees, and the second angle is between twenty and seventy degrees; and
    forming a power component in said region of the depressed first portion of the semiconductor body exposed by the aperture;
    wherein forming the power component comprises:
        forming at least one conduction region in the region of the depressed first portion of the semiconductor body exposed by the aperture; and
        forming a conduction contact that is connected to the at least one conduction region and crosses the STI insulation structure perpendicular to the top surface of the second portions of the semiconductor body.

2. The process according to claim 1, wherein forming the at least one conduction region comprises implanting a doping species through the aperture into the region exposed by the aperture.

3. The process according to claim 2, wherein the at least one conduction region is a source region.

4. The process according to claim 2, wherein the at least one conduction region is a body region and further comprising forming a source region in the body region.

5. The process according to claim 4, further comprising forming a gate region extending in part parallel to the top surface above the STI insulation structure and in part in the aperture parallel to the sidewall that is disposed at the second angle, said gate region positioned above a drain junction region in the region of the depressed first portion of the semiconductor body adjacent to the body region, and further positioned above a channel region defined by a portion of the body region between the drain junction region and the source region, and further positioned above part of the source region.

6. The process according to claim 1, wherein the second angle is less than the first angle by at least ten degrees.

7. A method, comprising:
    forming a first STI insulation structure in a semiconductor body to delimit an active area;
    implanting source and drain regions for a MOS transistor in the active area;
    forming a second STI insulating structure in the semiconductor body that extends above a depressed portion of the semiconductor body and laterally delimits projection portions of the semiconductor body, said second STI insulation structure having a sidewall with the projection portions of the semiconductor body that is disposed at a first angle with respect to a plane defined by a top surface of the active area that is less than ninety degrees;
    forming an aperture in the second STI insulation structure to expose a region of the depressed portion of the semiconductor body, said aperture having a sidewall that is disposed at a second angle with respect to the plane defined by the top surface of the active area that is less than the first angle, wherein the first angle is between eighty and ninety degrees, and the second angle is between twenty and seventy degrees; and
    implanting through the aperture a body region and a source region of a power transistor in the exposed region of the depressed portion of the semiconductor body.

8. The method of claim 7, further comprising forming a gate region for the power transistor that extends in part parallel to the top surface and above the second STI insulation structure and in part in the aperture parallel to the sidewall that is disposed at the second angle.

9. The method of claim 8, wherein forming the gate region further comprises extending the gate region in part over a surface of the exposed region of the depressed portion of the semiconductor body.

10. The method of claim 7, further comprising implanting a drain region of the power transistor in one of the projection portions of the semiconductor body.

11. The method of claim 7, further comprising forming an additional aperture in the second STI insulation structure to expose an additional region of the depressed portion of the semiconductor body.

12. The method of claim 11, further comprising implanting a drain region of the power transistor in said additional region of the depressed portion of the semiconductor body.

13. The method of claim 7, wherein said first STI insulation structure has a sidewall with the active area that is disposed at said first angle.

14. The method of claim 7, wherein the second angle is less than the first angle by at least ten degrees.

* * * * *